(12) United States Patent
Branca et al.

(10) Patent No.: US 9,048,724 B2
(45) Date of Patent: Jun. 2, 2015

(54) CONTROLLED SWITCH FOR OPENING OR CLOSING ON DEMAND A SECTION OF AN ELECTRICAL CIRCUIT OF A POWER STAGE

(75) Inventors: Xavier Branca, Grenoble (FR); David Chesneau, Saint Jean de Moirans (FR)

(73) Assignee: ST-ERICSSON SA, Plan-les-Ouates (CH)

( * ) Notice: Subject to any disclaimer, the term of this patent is extended or adjusted under 35 U.S.C. 154(b) by 158 days.

(21) Appl. No.: 13/820,594

(22) PCT Filed: Sep. 9, 2011

(86) PCT No.: PCT/EP2011/065692
§ 371 (c)(1),
(2), (4) Date: May 21, 2013

(87) PCT Pub. No.: WO2012/032176
PCT Pub. Date: Mar. 15, 2012

(65) Prior Publication Data
US 2014/0145700 A1    May 29, 2014

Related U.S. Application Data

(60) Provisional application No. 61/390,229, filed on Oct. 6, 2010.

(30) Foreign Application Priority Data

Sep. 10, 2010    (FR) ..................... 10 57233

(51) Int. Cl.
| G05F 1/00 | (2006.01) |
| H02M 1/08 | (2006.01) |
| H03K 17/10 | (2006.01) |
| H03K 17/687 | (2006.01) |
| H02M 3/158 | (2006.01) |
| H02M 1/00 | (2006.01) |

(52) U.S. Cl.
CPC .............. *H02M 1/08* (2013.01); *H03K 17/102* (2013.01); *H03K 17/6874* (2013.01); *H02M 3/1582* (2013.01); *H02M 2001/009* (2013.01)

(58) Field of Classification Search
USPC .................. 323/268, 270, 271, 282
See application file for complete search history.

(56) References Cited

U.S. PATENT DOCUMENTS

| 2007/0262759 A1* | 11/2007 | Burton et al. .................. 323/272 |
| 2009/0051333 A1* | 2/2009 | Jo et al. .......................... 323/235 |
| 2009/0195267 A1* | 8/2009 | Ho et al. ......................... 326/68 |
| 2009/0237062 A1* | 9/2009 | Tai et al. ....................... 323/311 |

FOREIGN PATENT DOCUMENTS

GB    2 415 099 A    12/2005

OTHER PUBLICATIONS

International Search Report issued in corresponding International application No. PCT/EP2011/065692, date of mailing Nov. 16, 2011.
Written Opinion of the International Searching Authority issued in corresponding International application No. PCT/EP2011/065692, date of mailing Nov. 16, 2011.

* cited by examiner

*Primary Examiner* — Adolf Berhane
*Assistant Examiner* — Gary Nash
(74) *Attorney, Agent, or Firm* — Patent Portfolio Builders PLLC

(57) ABSTRACT

The invention proposes a voltage regulating device having a switch in an electrical circuit between a first node (30, 140) and a second node (40, 130), comprising a first field effect transistor (21, 110) and a second field effect transistor (22, 120) connected in cascade. The switch is controlled by: —setting the gate (G1,G3) of the first transistor to a first electrical potential, and, —to close the switch, setting the gate (G2, G4) of the second transistor to the first potential, or —to open the switch, setting the gate of the second transistor to the electrical potential of the second node, with the difference between the first potential and the second potential then being adapted to allow opening the first transistor and the second transistor. The switch can be used in a switched-mode power supply.

9 Claims, 4 Drawing Sheets

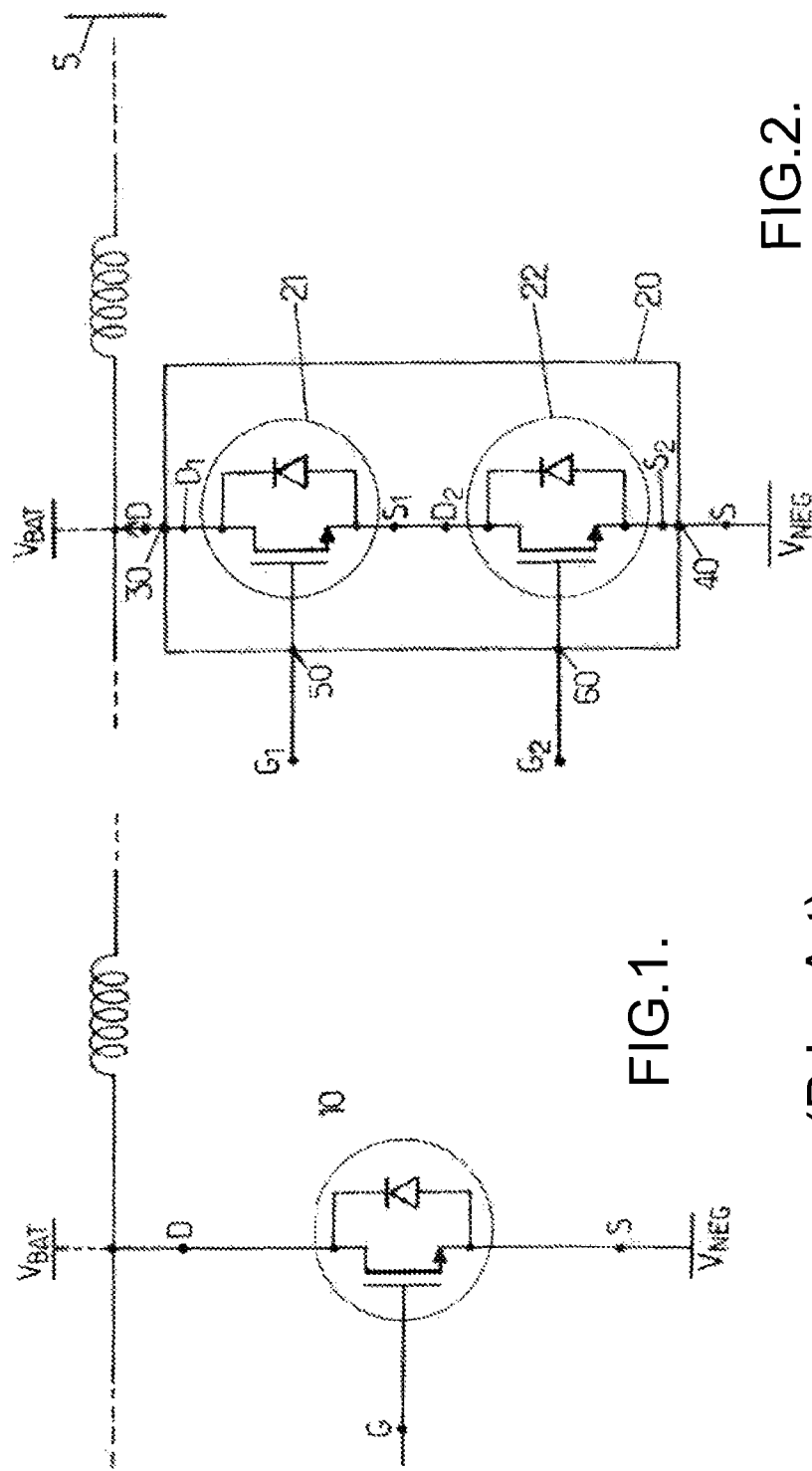

US 9,048,724 B2

CONTROLLED SWITCH FOR OPENING OR CLOSING ON DEMAND A SECTION OF AN ELECTRICAL CIRCUIT OF A POWER STAGE

TECHNICAL DOMAIN

This invention relates in general to controlled switches used in integrated circuits. It more particularly concerns devices for opening or closing on demand a section of an electrical circuit of a power stage, in a switched-mode power supply.

TECHNOLOGICAL BACKGROUND

In power stages, a switch controlled by a control signal is typically implemented by a metal-oxide-semiconductor transistor, commonly referred to using the acronym "MOS". A MOS transistor is driven by a control voltage. FIG. 1 shows a section of a power stage of a switched-mode power supply comprising a switch 10 controlled by control voltage $V_G$. The controlled switch 10 is a MOS transistor comprising a gate coupled to a node G, a drain coupled to a node D which is brought to a potential $V_{BAT}$, and a source coupled to a node S which is brought to a potential $V_{NEG}$. The control voltage $V_G$ is applied to the node G. Depending on the value of the control voltage $V_G$, the voltage $V_{DS}$ between the source and the drain of the transistor is either substantially zero (conducting transistor, corresponding to the closed state of the switch), or substantially equal to the voltage corresponding to the difference between the potential $V_{BAT}$ and the potential $V_{NEG}$ (non-conducting transistor, corresponding to the open state of the switch).

In the case of a power stage configured to provide a positive potential $V_{POS}$ of about 1.8 V and the negative potential $V_{NEG}$ of about −1.8 V, from the potential $V_{BAT}$ of 4.8 V supplied by a battery, the voltage $V_{DS}$ may reach 6.6 V. However, the MOS transistors able to support such a high voltage $V_{DS}$ are costly and/or unsuitable for production and application via reliable and cost-efficient industrial processes, particularly for the mass production of electrical circuits such as those used in the manufacture of mobile telephones.

BRIEF SUMMARY OF THE INVENTION

A need therefore exists for a controlled switch which opens or closes a section of an electrical circuit, particularly a power stage, in which a current having a voltage on the order of 6V can flow, wherein said switch can be manufactured and integrated during mass production using reliable and cost-efficient industrial processes.

A first aspect of the invention proposes a voltage regulating device (600) comprising:
a power stage comprising:
an input for receiving a first potential (VBAT),
an electrical circuit, comprising:
at least a first control input, and a second control input, and
at least a first switch comprising a first terminal and a second terminal. The first switch comprises:
a first control input and a second control input,
a first N-channel field effect transistor, comprising a first drain coupled to the first terminal, a first source, and a first gate coupled to the first control input, said first transistor only being closed if the voltage between the first gate and the first source is greater than a first threshold voltage, and a second N-channel field effect transistor, comprising a second drain coupled to the first source, a second source coupled to the second terminal, and a second gate adapted to be coupled to the second control input, said second transistor only being closed if the voltage between the second gate and the second source is greater than a second threshold voltage.
The first switch is adapted to be controlled
by setting the first control input to a first electrical control voltage, with the value of the first control voltage being less than that of a first maximum value of the electrical potential at the first terminal and greater than that of a value of the electrical potential at the second terminal, and,
to close the switch, by setting the second control input to the first maximum value of the first potential, or,
to open the switch, by setting the second control input to a second control voltage substantially equal to the electrical potential of the second terminal.
The difference between the first control voltage and the second control voltage is greater than both the value of the threshold voltage of the first transistor and the value of the threshold voltage of the second transistor when the switch is closed.
The switch is arranged to be controlled by a potential received on the first control input and a potential received on the second control input, in a manner that controls the conversion of the first potential into a second potential and into a third potential, said second terminal being coupled to a node of the circuit at the third potential when the circuit is in operation,
The power stage further comprises outputs for supplying the second potential and the third potential.
The device is further arranged so that the second potential is applied to the first control input of the switch.

Thus when the second transistor is non-conducting, the current between the first node and the second node is zero. As the gate of the first transistor is maintained at the first electrical potential, the intermediate connecting point between the first transistor and the second transistor is also polarized to the first potential. However, the value of the first potential is between that of the potential at the first node and that of the potential at the second node. Thus the maximum voltage between the intermediate connecting point and the second connecting point must be less than the voltage between the first node and the second node. Therefore the first and second transistor must each support a voltage, between their source and their drain, that is less than what has to be supported by a single transistor used as a switch. By reducing the maximum voltage supported by the first and the second transistor, it becomes possible to use manufacturing processes for the switch which are industrially efficient and less costly. It also becomes possible for the switch to be integrated.

A second aspect of the invention proposes a voltage regulating device comprising:
a power stage comprising:
an input for receiving a first potential,
an electrical circuit, comprising:
at least a first control input, and a second control input, and
at least a first switch comprising a first terminal and a second terminal. The first switch comprises:
a first control input and a second control input,
a first P-channel field effect transistor, comprising a first drain coupled to the first terminal, a first source, and a first gate coupled to the first control input, said first transistor only being open if the difference between the voltage of the first gate and the voltage of the first source is greater than a first threshold voltage, and a second P-channel field effect transistor, comprising a second drain coupled to the first source, a second source coupled to the second terminal, and a second gate adapted to be coupled to the second control input, said second transistor only being open if the voltage between the second gate and the second source is greater than a second threshold voltage.

The first switch is adapted to be controlled by setting the first control input to a first electrical control voltage, with the value of said first control voltage, being less than a first minimum value of the electrical potential at the second terminal and greater than that of the value of the electrical potential at the first terminal, and, to close the switch, by setting the second control input to the first minimum value of the first potential, or, to open the switch, by setting the second control input to a second control voltage, substantially equal to the electrical potential of the second terminal.

The difference between the second control voltage and the first control voltage is greater than both the value of the threshold voltage of the first transistor and the value of the threshold voltage of the second transistor when the switch is closed.

The switch is arranged to be controlled by a potential received on the first control input and a potential received on the second control input, in a manner that controls the conversion of the first potential into a second potential and into a third potential, the second terminal being coupled to a node of the circuit at the first potential when the circuit is in operation.

The power stage further comprises outputs for supplying the second potential and the third potential.

The device is further arranged so that a reference potential is applied to the first control input of the switch.

Embodiments of the first aspect of the invention propose a voltage regulating device further comprising a control and driving circuit, coupled to the outputs from the power stage, and configured to define and apply a control strategy for the power stage by:

applying the second potential to the first control input of the switch, applying, to the second control input of the switch:
the third potential to open the first switch,
the second potential to close the first switch.

The first transistor and second transistor of the first switch can be effectively and easily controlled using the second and third potential. It is then unnecessary to generate intermediate potentials, which simplifies the driving circuit and reduces the design and production costs, the difference between the first potential and the second potential being greater than or equal to the threshold voltage of the first and second transistors, and the opposite of the value of the third potential being greater than the threshold voltage of the first and second transistors. The device may also be efficiently implemented by using industrially efficient and less costly production methods, as it comprises switches according to the first aspect.

Embodiments of the second aspect of the invention proposes a voltage regulating device further comprising a control and driving circuit, coupled to the outputs from the power stage, and configured to define and apply a control strategy of the power stage by:

applying, to the first control input of the switch, a reference potential of the electrical circuit, applying, to the second control input:
the first potential to open the first switch,
the reference potential to close the first switch.

The control of the first transistor and the second transistor of the first switch can be efficiently and easily implemented using the second and the reference potential, or ground, of the circuit. It is therefore unnecessary to generate intermediate potentials, which simplifies the driving circuit and reduces the design and production costs. The device can also be efficiently implemented using industrially effective and less costly manufacturing processes, as it comprises switches according to the second aspect.

A third aspect of the invention proposes a device according to the first or second aspect, in which the electrical circuit comprises:

at least a third control input, and a fourth control input, and, at least a second switch, comprising a third terminal and a fourth terminal, with said second switch able to be controlled by a potential received on the third control input, and a potential received on the fourth control input, in a manner that controls the conversion of the first potential into a second potential and into a third potential, the fourth terminal being coupled to a node of the circuit at the reference potential when the circuit is in operation.

The second switch comprises:

a third N-channel field effect transistor, comprising a third drain coupled to the third terminal, a third source, and a third gate adapted to be coupled to the third control input, and a first body diode of which the cathode is coupled to the third terminal, said third transistor only being open if the voltage between the third gate and the third source is greater than a third threshold voltage, and a fourth N-channel field effect transistor, comprising a fourth drain coupled to the fourth terminal, a fourth source coupled to the source of the third transistor, and a second gate adapted to be coupled to the fourth control input, said fourth transistor only being open if the voltage between the fourth gate and the fourth source is greater than a fourth threshold voltage.

The control and driving circuit is also configured to define and apply the control strategy for the power stage by:

setting the third control input and the fourth control input to the third potential, to open the second switch, or setting the third control input to the third potential and the fourth control input to the second potential, to open the second switch, or setting the third control input and the fourth control input to the second potential, to close the second switch.

The difference between the second potential and the reference potential is greater than the value of the fourth threshold voltage, and the difference between the third potential and the reference potential is less than the value of the third threshold voltage.

One issue encountered in power stages is related to the leakage current from MOS transistors, which results from the presence of a body diode inside them. Depending on the layout of the transistor and the sign of the voltage between its drain and its source, a leakage current may pass through the body diode although the transistor is non-conducting. In a power stage, this leakage current can cause significant energy loss and interfere with the general operation. The device according to the fifth aspect comprises a controlled switch adapted to open or close a section of an electrical circuit of a power stage, through which a current may flow, having a voltage on the order of 6V, and adapted to suppress the leakage current when the switch is open for any polarity of its terminals, said switch being suitable for mass production and integration using reliable and cost-efficient industrial processes.

Indeed, when it is open, the second switch suppresses leakage currents, particularly due to the back-to-back assembly of the body diodes of the third and fourth transistor and due to the change in potential of the fourth control input according to the polarity of the third terminal.

A fourth aspect proposes a power supply comprising a device according to the second aspect.

A fifth aspect proposes a portable device comprising a power supply according to the first aspect.

A sixth aspect proposes a method for controlling a switch according to the first aspect, comprising:
- a step of setting the first control input to a first electrical potential, the value of the first potential being within an open interval delimited by two bounds respectively equal to a first maximum value of the electrical potential at the first terminal and a value of the electrical potential at the second terminal, and
- to close the switch, a step of setting the second control input to the first maximum value of the first potential, or
- to open the switch, a step of setting the second control input to a second potential substantially equal to the electrical potential of the second terminal, with the difference between the first potential and the second potential being greater than both the value of the threshold voltage of the first transistor and the value of the threshold voltage of the second transistor.

A seventh aspect proposes a method for controlling a switch according to the second aspect, comprising:
- a step of setting the first control input to a first electrical potential, the value of the first potential being within an open interval delimited by two bounds respectively equal to a value of the electrical potential at the first terminal and to a first minimum value of the electrical potential at the second terminal, and
- to close the switch, a step of setting the second control input to a first minimum value of the first potential, or
- to open the switch, a step of setting the second control input to a second potential substantially equal to the electrical potential of the second terminal (140), with the difference between the second potential and the first potential being greater than both the value of the threshold voltage of the first transistor and the value of the threshold voltage of the second transistor.

BRIEF DESCRIPTION OF DRAWINGS

Other features and advantages of the invention will be more apparent from reading the following description. This description is purely illustrative and is to be read with reference to the attached drawings, in which:

FIG. 1, described above, is a schematic diagram of a power stage of a switched-mode power supply, comprising a controlled switch of the prior art, FIG. 2 is a schematic diagram representing a controlled switch according to one embodiment, included in a section of an electrical circuit of a power stage.

DESCRIPTION OF EMBODIMENTS

Figure 3:
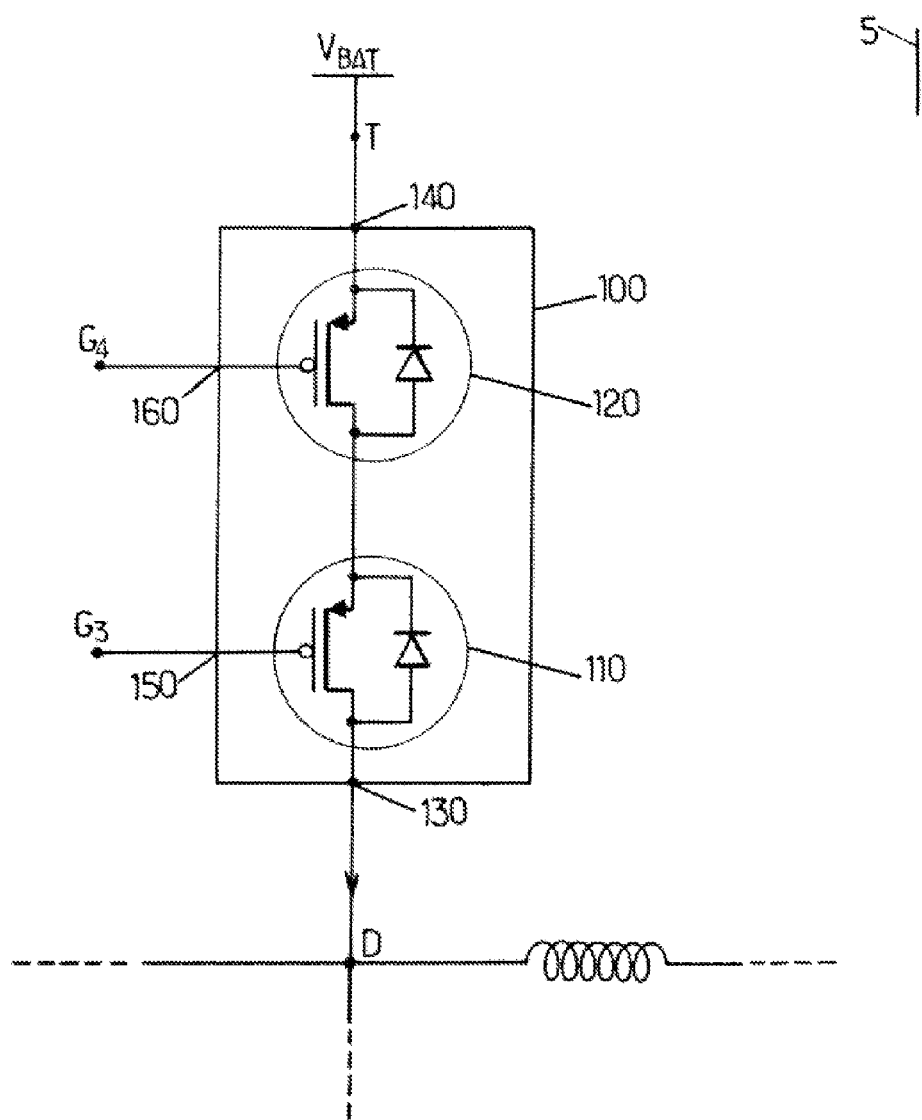
FIG. 3 is a schematic diagram representing a controlled switch according to another embodiment, included in another section of the electrical circuit, FIGS. 4-A and 4-B are schematic diagrams illustrating a controlled switch according to another embodiment, in different configurations and included in another section of the electrical circuit.

In this description, when it refers to a voltage at a node of a circuit, this is understood to mean the difference between the potential at said node and a reference potential common to the entire circuit. The reference potential is also commonly referred to as the ground, and has a value that is generally equal to 0V.

One embodiment of a controlled switch 20, included in a section of an electrical circuit 5 of a power stage, is represented in FIG. 2. The switch 20 comprises a first coupling node 30 and a second coupling node 40. The switch 20 also comprises at least a first control input 50 and a second control input 60. The switch 20 is adapted to open or close an electrical circuit between the first coupling node 30 and the second coupling node 40, as a function of the control voltages received on the first input 50 and the second input 60. In the example in FIG. 2, the first coupling point 30 is coupled to a node D of the circuit 5, and the second coupling point 40 to a node S of the circuit 5. The voltage at the node S is equal to a voltage $V_{NEG}$.

The switch 20 comprises a first transistor 21 and second transistor 22 connected in cascade. The first and second transistors are typically metal-oxide-semiconductor transistors, more commonly referred to as MOS transistors, each comprising a gate, a drain, and a source. In the example in FIG. 2, the first and second transistors are N-channel MOS transistors, or NMOS transistors.

The first transistor 21 is conducting, meaning it allows current to pass between its drain and its source, when the difference in potential $V_{GS}$ between its gate and its source is greater than a first threshold $V_{TH1}$. Otherwise, meaning if $V_{GS} < V_{TH1}$, the first transistor 21 is non-conducting. The second transistor 22 is conducting, meaning it allows current to pass between its drain and its source, when the difference in potential $V_{GS}$ between its gate and its source is greater than a second threshold $V_{TH2}$. Otherwise, meaning if $V_{GS} < V_{TH2}$, the second transistor 22 is non-conducting.

The first transistor 21 is placed in the switch 20 so that its gate is coupled to the first input 50, its drain to the first coupling node 30, and its source to the drain of the second transistor 22. The second transistor 22 is placed in the switch 20 so that its gate is coupled to the second input 60, its drain to the source of the first transistor 21, and its source to the second coupling node 40.

The switch 20 is adapted to be controlled by a first control voltage $T_1$ received on the first input 50, and by a second control voltage $T_2$ received on the second input 60. The value $V_1$ of the first control voltage $T_1$ is less than that of the voltage $V_{BAT}$ and greater than that of the voltage $V_{NEG}$. The value $V_1$ of the first control voltage $T_1$ is substantially constant.

The second control voltage $T_2$ can substantially assume two values:
- a first value $V_{21}$ which is substantially equal to the value $V_1$ of the first control voltage $T_1$
- a second value $V_{22}$ which is less than the value $V_1$ of the first control voltage $T_1$ and greater than or equal to that of the voltage $V_{NEG}$.

The second transistor 22 is configured in the circuit so as to be:
- conducting when the second control voltage has a value substantially equal to the first value $V_{21}$,
- non-conducting when the second control voltage has a value substantially equal to the second value $V_{22}$.

To close the switch 20, and therefore allow current to flow between the first and second coupling nodes, the control voltage T2 is applied to the second input 60 while ensuring that the value of said control voltage is equal to the value $V_{21}$. The difference in potential $V_{GS}$ between the gate and the source of the second transistor is then equal to the difference between the value $V_1$ and the value of the voltage $V_{NEG}$, and this difference in potential $V_{GS}$ is greater than the threshold $V_{TH2}$. Conversely, in order to open the switch 20 and therefore prevent current from flowing between the first and second coupling nodes, the control voltage $T_2$ is applied to the second input 60 while ensuring that the value of said control voltage is equal to the value $V_{22}$. Whether the switch 20 is closed or open, the value of the first control voltage $T_1$ is maintained at the value $V_1$. The difference in potential $V_{GS}$ between the gate and the source of the second transistor is then substantially zero and less than the threshold $V_{TH2}$.

In one embodiment, the circuit 5 is used to supply a positive voltage $V_{POS}$ and the negative voltage $V_{NEG}$, from the voltage $V_{BAT}$. The switch 20 is then coupled to the circuit so that the first input 50 receives the positive voltage $V_{POS}$, and the second input 60 receives either the positive voltage $V_{POS}$ or the negative voltage $V_{NEG}$, depending on whether the switch is to be closed or open.

As a non-limiting example, the voltage $V_{BAT}$ is supplied by a battery, at a value substantially equal to 4.8V. The positive voltage $V_{POS}$ and the negative voltage $V_{NEG}$ are symmetrical voltages respectively equal to 1.8V and −1.8V. The values $V_1$ and $V_{21}$ are equal to the positive voltage $V_{POS}$, which is 1.8V. The value $V_{22}$ is equal to the negative voltage $V_{NEG}$, which is −1.8V. When the switch 20 is open, the difference in potential between the first and second coupling nodes is therefore substantially equal to 6.6V. The voltage $V_{GS}$ between the gate and the source of the first transistor is then zero, because the current between the first and second coupling nodes is zero. As a result, the voltage at the drain of the second transistor 22 is equal to $V_1$, which is 1.8V. The first and second transistor can therefore be designed and manufactured to support a maximum difference in potential of only 3V and 3.6V respectively.

A controlled switch 100, according to another embodiment and included in a section of the electrical circuit 5, is represented in FIG. 3. The switch 100 comprises a first coupling node 130 and a second coupling node 140. The switch 100 also comprises at least a first control input 150 and a second control input 160. The switch 100 is adapted to open or close an electrical circuit between the first coupling node 130 and the second coupling node 140, as a function of the control voltages received in particular on the first input 150 and the second input 160. In the example in FIG. 3, the first coupling point 30 is coupled to the node D, and the second coupling point 40 to the node T. The voltage at the node D is equal to the voltage $V_{BAT}$, and the voltage at the node T is equal to the voltage $V_{NEG}$.

The switch 100 comprises a first transistor 110 and a second transistor 120 connected in cascade. The first and second transistors are typically metal-oxide-semiconductor transistors, more commonly referred to as MOS transistors, each comprising a gate, a drain, and a source. More particularly, in the example in FIG. 3, the first and second transistors are P-channel MOS transistors or PMOS transistors.

The first transistor 110 is conducting, meaning that it allows current to pass between its drain and its source, when the difference in potential $V_{GS}$ between its gate and its source is less than a threshold $V_{TH3}$. Otherwise, meaning if $V_{GS} > V_{TH3}$, the first transistor 110 is non-conducting. The second transistor 120 is conducting, meaning it allows current to pass between its drain and its source, when the difference in potential $V_{GS}$ between its gate and its source is less than a threshold $V_{TH4}$. Otherwise, meaning if $V_{GS} > V_{TH4}$, the second transistor 120 is non-conducting.

The first transistor 110 is placed in the switch 100 so that its gate is coupled to the first input 150, its drain to the first coupling node 130, and its source to the drain of the second transistor 120. The second transistor 120 is placed in the switch 100 so that its gate is coupled to the second input 160, its drain to the source of the first transistor 110, and its source to the second coupling node 140.

The switch 100 is adapted to be controlled by a first control voltage $T_3$ received on the first input 150, and by a second control voltage $T_4$ received on the second input 160. The value $V_3$ of the first control voltage $T_3$ is less than that of the voltage $V_{BAT}$ and greater than that of the voltage $V_{NEG}$. The value $V_3$ of the first control voltage $T_3$ is substantially constant.

The second control voltage $T_4$ can substantially assume two values:
  a first value $V_{41}$ which is substantially equal to the value $V_3$ of the first control voltage $T_3$,
  a second value $V_{42}$ which is greater than the value $V_3$ of the first control voltage $T_3$ and less than or equal to that of the voltage $V_{BAT}$.

The second transistor 120 is configured in the circuit to be:
  conducting when the second control voltage has a value substantially equal to the first value $V_{41}$,
  non-conducting when the second control voltage has a value substantially equal to the second value $V_{42}$.

Thus, to close the switch 100 and therefore allow current to flow between the first and second coupling nodes, it is sufficient to apply the control voltage $T_4$ to the second input 160 while ensuring that the value of said control voltage is equal to the value $V_{41}$. The difference in potential $V_{GS}$ between the gate and the source of the second transistor is then equal to the difference between the value $V_3$ and the voltage $V_{BAT}$, and this difference in potential $V_{GS}$ is less than the threshold $V_{TH4}$. Otherwise, to open the switch 100 and therefore prevent current from flowing between the first and the second coupling node, the control voltage $T_4$ is applied to the second input 160 while ensuring that the value of said control voltage is equal to the value $V_{42}$. The difference in potential $V_{GS}$ between the gate and the source of the second transistor is then substantially zero and greater than the threshold $V_{TH4}$. Whether the switch 20 is open or closed, the value of the first control voltage $T_1$ is maintained at the value $V_1$.

In one embodiment, the circuit 5 is used to supply the positive voltage $V_{POS}$ and the negative voltage $V_{NEG}$, from the voltage $V_{BAT}$. The switch 100 is then coupled to the circuit so that the first input 150 is coupled to the reference potential of the circuit 45, and the second input 160 is coupled either to the voltage $V_{BAT}$ or to the reference potential of the circuit 5, depending on whether the switch is to be closed or open.

As a non-limiting example, the voltage $V_{BAT}$ is for example supplied by a battery, and has a value substantially equal to 4.8V. The values $V_3$ and $V_{41}$ are equal to that of the reference potential, which is 0V. The value $V_{42}$ is equal to that of the voltage $V_{BAT}$, which is 4.8V. The maximum potential difference between the first and the second coupling node is therefore substantially equal to 6.6V. When the switch 100 is open, the voltage $V_{GS}$ between the gate and the source of the first transistor is also zero, because the current between the first and second coupling node is zero. As a result, the value of the voltage at the drain of the second transistor 120 is equal to the value $V_3$, which is 0V. The first and second transistor can therefore be manufactured to support a maximum potential difference of only 1.8V and 4.8V respectively, when the node D is at the negative voltage $V_{NEG}$.

Figure 4A:
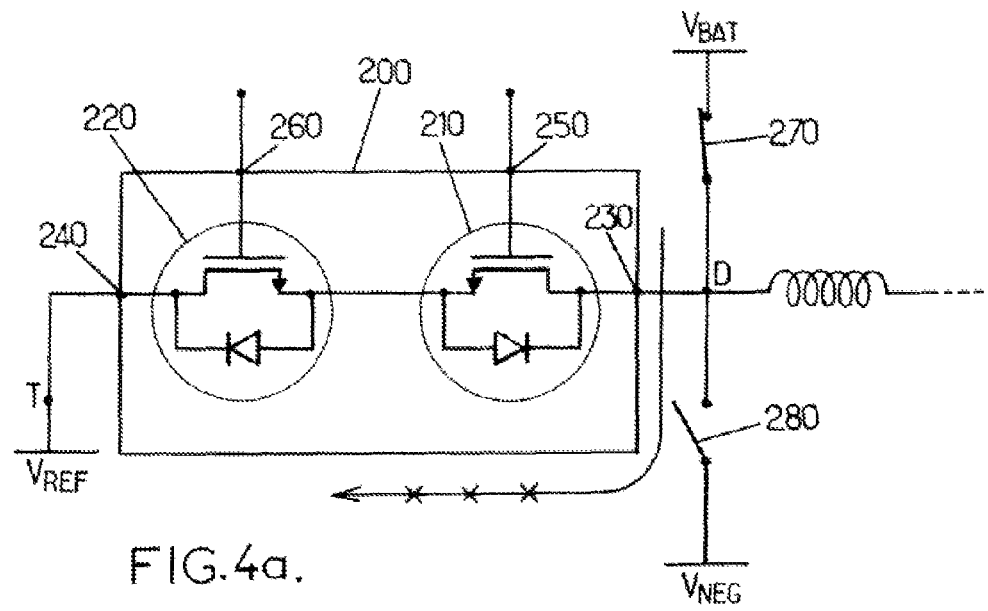
Figure 4B:
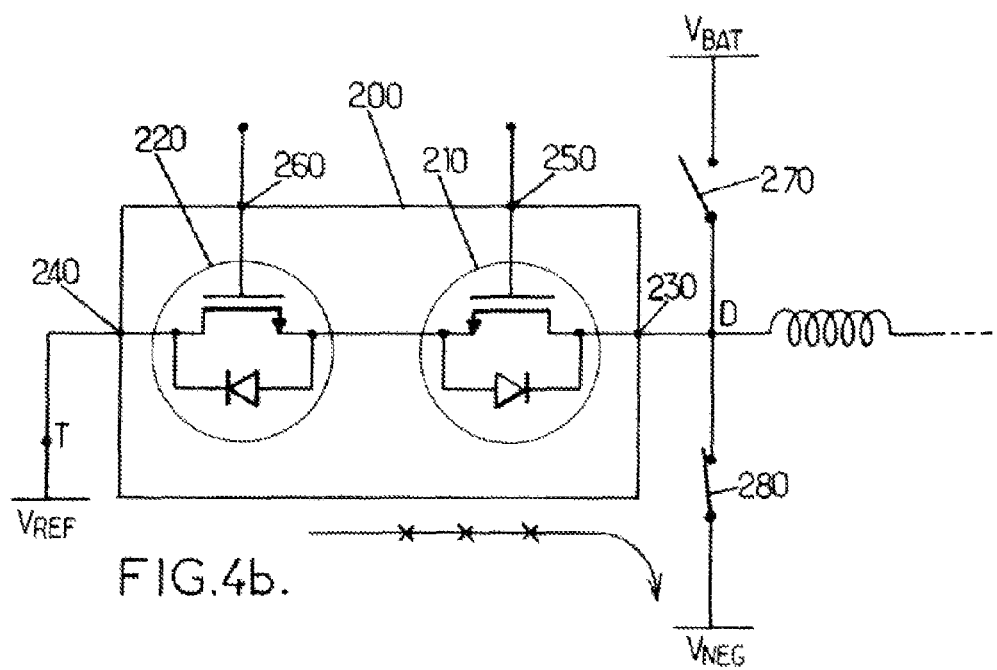

A controlled switch 200, according to one embodiment and included in a section of the electrical circuit 5, is represented in FIGS. 4a and 4b. The switch 200 comprises a first coupling node 230 and a second coupling node 240. The switch 200 also comprises at least a first control input 250 and a second control input 260. The switch 200 is adapted to open or close an electrical circuit between the first coupling node 230 and the second coupling node 240, as a function of the control voltages received in particular on the first input 250 and second input 260. In the example in FIGS. 4a and 4b, the first coupling node 230 is coupled to the node D, and the second coupling node 240 to a node T. The potential at the node T is equal to the reference potential.

The switch 20 comprises a first transistor 210 and a second transistor 220 connected in cascade. The first and second transistor are typically metal-oxide-semiconductor transistors, more commonly referred to as MOS transistors, each comprising a gate, a drain, a source, and a body diode. In the example in FIGS. 4a and 4b, the first and second transistors are N-channel MOS transistors, or NMOS transistors.

The first transistor 210 is placed in the switch 200 so that its gate is coupled to the first input 250, its drain to the first coupling node 230, its source to the source of the second transistor 220, and the cathode of the body diode to the first connection node 230. The second transistor 220 is placed in the switch 200 so that its gate is coupled to the second input 260, its source to the source of the first transistor 210, its drain to the second coupling node 240, and the cathode of the body diode to the second connection node 240. The body diodes of the first and second transistors are therefore assembled back to back.

The switch 200 is adapted to be controlled by a first control voltage $T_5$ received on the first input 250, and by a second control voltage $T_6$ received on the second input 260. To open the switch 200, the value $V_5$ of the first control voltage $T_5$ is equal to that of the negative voltage $V_{NEG}$, and the value $V_6$ of the second control voltage $T_6$ is equal to that of the negative voltage $V_{NEG}$. As the body diodes are reverse polarized in both directions, no current can flow. To close the switch 200, the value $V_6$ of the second control voltage $T_6$ is equal to the positive voltage $V_{POS}$. Thus the second transistor 220 is conducting, and current flows in the body diode of the first transistor 210 while the latter is non-conducting. To open the switch 200 when the switch 210 and the switch 220 are non-conducting, the first control voltage $T_5$ is equal to the voltage $V_{NEG}$ and the second control voltage $T_6$ is equal to the voltage $V_{POS}$.

In one embodiment, the circuit 5 is used to supply a positive voltage $V_{POS}$ and the negative voltage $V_{NEG}$, from the voltage $V_{BAT}$. The switch 200 is then coupled to the circuit so that the first input 250 is coupled to the negative voltage $V_{NEG}$ or to the positive voltage $V_{POS}$, and the second input 260 is coupled either to the negative voltage $V_{NEG}$ or to the positive voltage $V_{POS}$, depending on whether current is to be prevented from flowing in the body diodes of the first and second transistors 210, 220 when the first and second transistors 210, 220 are also non-conducting.

As a non-limiting example, the voltage $V_{BAT}$ is supplied by a battery, and has a value substantially equal to 4.8V. The controlled switch 200 allows opening the circuit 5 between the nodes D and T, for any polarity of the node D. The positive voltage $V_{POS}$ and the negative voltage $V_{NEG}$ are symmetrical voltages of values 1.8V and −1.8V respectively. The value $V_5$ is equal to the negative voltage $V_{NEG}$, which is −1.8V. The value $V_6$ is equal either to the positive voltage $V_{POS}$, 1.8V, or to the negative voltage $V_{NEG}$, −1.8V. Thus, to open the switch 200 when the switch 270 is closed and the switch 280 open, corresponding to the situation where the node D has a positive polarity as represented in FIG. 4a, the first control voltage $T_5$ is equal to the voltage $V_{NEG}$ and the second control voltage $T_6$ is equal to the voltage $V_{POS}$. To open the switch 200 when the switch 270 is open and the switch 280 closed, corresponding to the situation where the node D has a negative polarity as represented in FIG. 4b, the first control voltage $T_5$ and the second control voltage $T_6$ are equal to the voltage $V_{NEG}$. As the body diodes of the first and second transistors are assembled back to back, no leakage current can pass through the switch 200 when said switch is open. To open the switch 200 when the switch 270 and the switch 280 are non-conducting, the first control voltage $T_5$ is equal to the voltage $V_{NEG}$ and the second control voltage $T_6$ is equal to the voltage $V_{POS}$.

Figure 5:
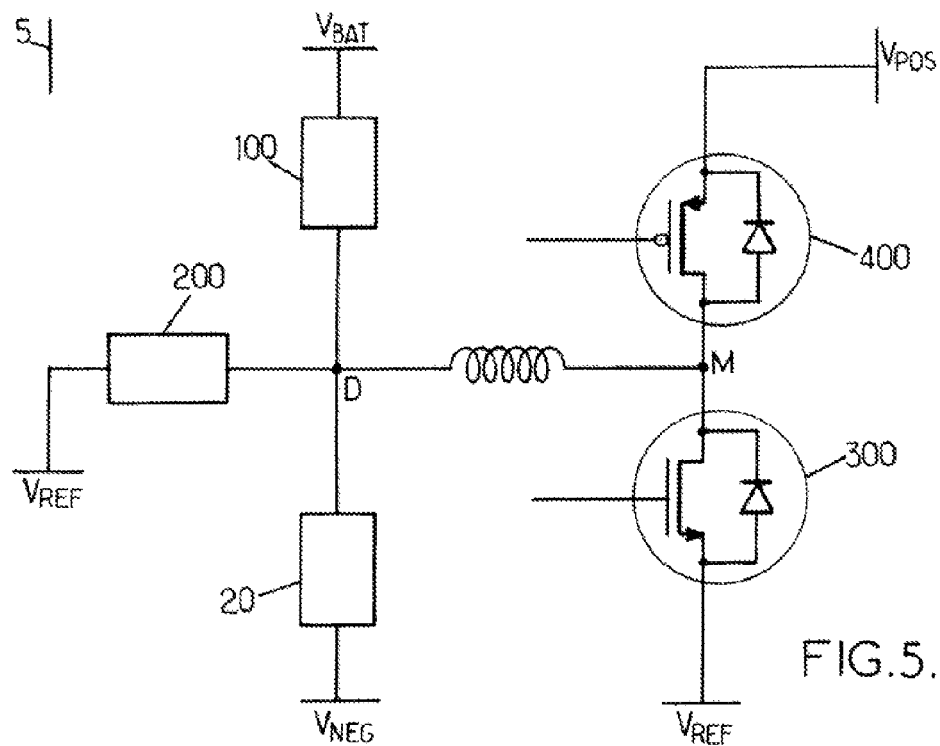
FIG. 5 is a block diagram of an electrical circuit of a power stage according to one embodiment.
Figure 6:
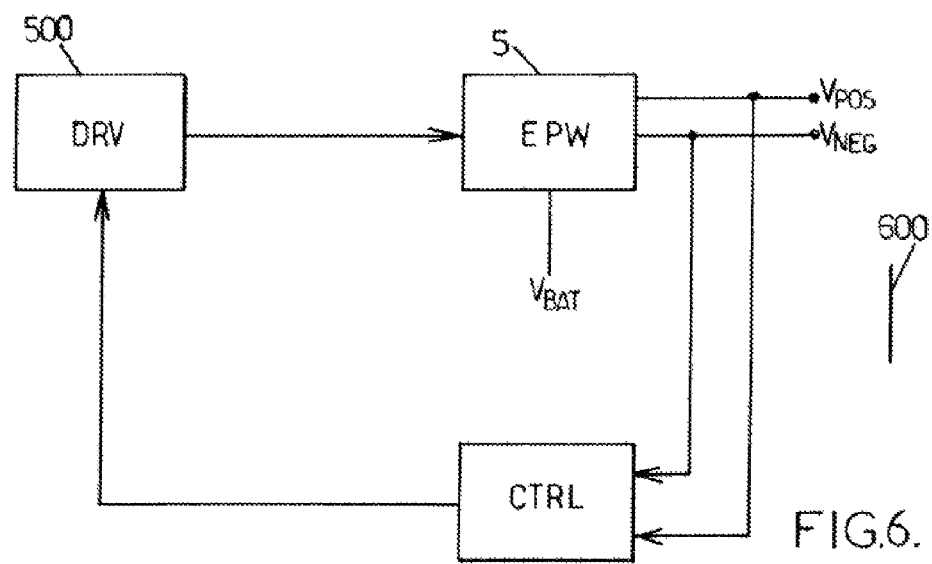
FIG. 6 is a schematic diagram of a power supply according to one embodiment.

The circuit 5 comprising the previously described switches 20, 100, and 200 can in particular be used in a power supply 600, as represented in FIGS. 5 and 6. The power supply 600 is, for example, a voltage regulating device coupled to a voltage source supplying a voltage $V_{BAT}$, for example a storage cell such as a battery. The power supply 600 is, for example, contained in a portable device such as a mobile telephone, a portable audio and/or video player, or a laptop computer. The power supply 600 comprises a power stage implemented by the circuit 5, adapted to supply a positive voltage $V_{POS}$ and a negative voltage $V_{NEG}$, with the absolute value of the positive voltage $V_{POS}$ being for example substantially equal to the absolute value of the negative voltage $V_{NEG}$. The power stage is equipped with control inputs for receiving control voltages defining a control strategy for producing the negative voltage $V_{NEG}$ and the positive voltage $V_{POS}$. The power supply comprises a control circuit coupled to the power stage outputs in order to compare over time the negative $V_{NEG}$ and positive $V_{POS}$ voltages to at least one reference voltage $V_{REF}$ and to produce error signals $V_{err1}$, $V_{err2}$. The power supply comprises a driving circuit 500 coupled to the control circuit in order to receive the error signals $V_{err1}$ $V_{err2}$ and to generate the control voltages, and to the power stage in order to supply the control voltages so generated.

The invention claimed is:
1. A voltage regulating device comprising:
a power stage comprising:
an input for receiving a first potential,
an electrical circuit, comprising:
at least a first control input, and a second control input, and
at least a first switch comprising a first terminal and a second terminal, wherein it comprises:
said first control input and said second control input,
a first N-channel field effect transistor, comprising a first drain coupled to the first terminal, a first source, and a first gate coupled to the first control input, said first transistor only being closed if the voltage between the first gate and the first source is greater than a first threshold voltage, and
a second N-channel field effect transistor, comprising a second drain coupled to the first source, a second source coupled to the second terminal, and a second gate adapted to be coupled to the second control input, said second transistor only being closed if the voltage between the second gate and the second source is greater than a second threshold voltage,
the first switch being adapted to be controlled
by setting the first control input to a first electrical control voltage, with the value of the first control voltage being less than that of the maximum value of the electrical potential at the first terminal and greater than that of the value of the electrical potential at the second terminal, and to close the switch, by setting the second control input to the first maximum value of the first potential, or, to open the switch, by setting the second control input to a second control voltage substantially equal to the electrical potential of the second terminal, the difference between the first control voltage and the second control voltage being greater than both the value of the threshold voltage of the first transistor and the value of the threshold voltage of the second transistor when the switch is closed the switch being able to be controlled by a potential received on the first control input and a potential received on the second control input, in a manner that controls the conversion of the first potential into a second potential and into a third potential, said second terminal being coupled to a node of the circuit at the third potential when the circuit is in operation, outputs for supplying the second potential and the third potential, wherein, the second potential is applied to the first control input of the switch.

2. A device according to claim 1 further comprising a control and driving circuit, coupled to the outputs from the power stage, and configured to define and apply a control strategy for the power stage by:

applying the second potential to the first control input of the switch, applying, to the second control input of the switch:
the third potential to open the first switch, and
the second potential to close the first switch.

3. A device according to claim 2, wherein the electrical circuit comprises:

at least a third control input, and a fourth control input, and at least a second switch, comprising a third terminal and a fourth terminal, with said second switch able to be controlled by a potential received on the third control input, and a potential received on the fourth control input, in a manner that controls the conversion of the first potential into a second potential and into a third potential, the fourth terminal being coupled to a node of the circuit at the reference potential when the circuit is in operation, with the second switch comprising:
a third N-channel field effect transistor, comprising a third drain coupled to the third terminal, a third source, and a third gate adapted to be coupled to the third control input, and a first body diode of which the cathode is coupled to the third terminal, said third transistor only being open if the voltage between the third gate and the third source is greater than a third threshold voltage, and a fourth N-channel field effect transistor, comprising a fourth drain coupled to the fourth terminal, a fourth source coupled to the source of the third transistor, and a second gate adapted to be coupled to the fourth control input, said fourth transistor only being open if the voltage between the fourth gate and the fourth source is greater than a fourth threshold voltage, the control and driving circuit also being configured to define and apply the control strategy for the power stage by:

setting the third control input and the fourth control input to the third potential, to open the second switch, or setting the third control input to the third potential and the fourth control input to the second potential, to open the second switch, or setting the third control input and the fourth control input to the second potential, to close the second switch, with the difference between the second potential and the reference potential being greater than the value of the fourth threshold voltage, and the difference between the third potential and the reference potential being less than the value of the third threshold voltage.

4. A power supply comprising a device according to claim 1, coupled to a voltage source for supplying the first potential.

5. A portable device comprising a power supply according to claim 4.

6. A method for controlling a switch according to claim 1 comprising:

a step of setting the first control input to a first electrical potential, the value of the first potential being within an open interval delimited by two bounds respectively equal to a first maximum value of the electrical potential at the first terminal and to a value of the electrical potential at the second terminal, and to close the switch, a step of setting the second control input to the first maximum value of the first potential, or to open the switch, a step of setting the second control input to a second potential substantially equal to the electrical potential of the second terminal, and with the difference between the first potential and the second potential being greater than both the value of the threshold voltage of the first transistor and the value of the threshold voltage of the second transistor.

7. A voltage regulating device comprising:
a power stage comprising:
an input for receiving a first potential,
an electrical circuit, comprising:
at least a first control input, and a second control input, and at least a first switch comprising a first terminal and a second terminal, wherein it comprises:
a first control input and a second control input,
a first P-channel field effect transistor, comprising a first drain coupled to the first terminal, a first source, and a first gate coupled to the first control input, said first transistor only being open if the difference between the voltage of the first gate and the voltage of the first source is greater than a first threshold voltage, and a second P-channel field effect transistor, comprising a second drain coupled to the first source, a second source coupled to the second terminal, and a second gate adapted to be coupled to the second control input, said second transistor only being open if the difference between the voltage of the second gate and the voltage of the second source is greater than a second threshold voltage, the switch being adapted to be controlled
by setting the first control input to a first electrical control voltage, with the value of the first control voltage being less than a first minimum value of the electrical potential at the second terminal and greater than the value of the electrical potential at the first terminal, and to close the switch, by setting the second control input to the first minimum value of the first potential, or to open the switch, by setting the second control input to a second control voltage substantially equal to the electrical potential of the second terminal, the difference between the second control voltage and the first control voltage being greater than both the value of the threshold voltage of the first transistor and the value of the threshold voltage of the second transistor when the switch is closed, the switch being able to be controlled by a potential received on the first control input and a potential received on the second control input, in a manner that controls the conversion of the first potential into a second potential and into a third potential, the second terminal being coupled to a node of the circuit at the first potential when the circuit is in operation, outputs for supplying the second potential and the third potential, wherein, a reference potential is applied to the first control input of the switch.

8. A device according to claim 7 further comprising a control and driving circuit, coupled to the outputs from the power stage, and configured to define and apply a control strategy of the power stage by:

applying, to the first control input of the switch, a reference potential of the electrical circuit, applying, to the second control input:
the first potential to open the first switch, and
the reference potential to close the first switch.

9. A method for controlling a switch according to claim 7 comprising:

a step of setting the first control input to a first electrical potential, the value of the first potential being within an open interval delimited by two bounds respectively equal to a value of the electrical potential at the first terminal and to a first minimum value of the electrical potential at the second terminal, and to close the switch, a step of setting the second control input to a first minimum value of the first potential, or to open the switch, a step of setting the second control input to a second potential substantially equal to the electrical potential of the second terminal, with the difference between the second potential and the first potential being greater than both the value of the threshold voltage of the first transistor and the value of the threshold voltage of the second transistor.

\* \* \* \* \*